United States Patent [19]

Johnson et al.

[11] Patent Number: 4,472,239
[45] Date of Patent: Sep. 18, 1984

[54] METHOD OF MAKING SEMICONDUCTOR DEVICE

[75] Inventors: Robert G. Johnson, Minnetonka; Robert E. Higashi, Minneapolis, both of Minn.

[73] Assignee: Honeywell, Inc., Minneapolis, Minn.

[21] Appl. No.: 512,079

[22] Filed: Jul. 8, 1983

Related U.S. Application Data

[62] Division of Ser. No. 310,345, Oct. 9, 1981.

[51] Int. Cl.³ .................. H01L 21/306; B44C 1/22; C03C 15/00; C03C 25/06
[52] U.S. Cl. ........................... 156/647; 29/580; 156/653; 156/657; 156/659.1; 156/662; 156/648; 357/55; 357/69; 427/88
[58] Field of Search ............... 156/647–649, 156/657, 659.1, 661.1, 653, 662; 430/313, 316, 312, 318; 427/88–90; 422/95, 97, 98; 29/580, 591, 573; 357/55, 68, 69, 71; 73/23, 704, 723, 778

[56] References Cited

U.S. PATENT DOCUMENTS

| | | | |
|---|---|---|---|
| 3,758,830 | 9/1973 | Jackson | 317/234 R |
| 3,881,181 | 4/1975 | Khajezadeh | 357/69 |
| 3,992,940 | 11/1976 | Platzer, Jr. | 73/204 |
| 4,011,745 | 3/1977 | Gatos et al. | 73/23 |
| 4,134,095 | 1/1979 | Reddy | 338/25 |
| 4,182,937 | 1/1980 | Greenwood | 179/110 B |
| 4,229,979 | 10/1980 | Greenwood | 73/704 |
| 4,244,225 | 1/1981 | Greenwood | 73/517 AV |
| 4,293,373 | 10/1981 | Greenwood | 156/628 |
| 4,305,298 | 12/1981 | Greenwood | 73/651 |
| 4,343,768 | 8/1982 | Kimura | 422/97 |
| 4,389,429 | 6/1983 | Soclof | 156/647 X |

OTHER PUBLICATIONS

Conference: 1978 International Electron Devices Meeting Washington, D.C., U.S.A., Dec. 4-6, 1978, Micromechanical Voltage Controlled Switches and Circuits, Kurt E. Petersen, pp. 100–103.
Bassous, Ernest, "Fabrication of Novel Three-Dimensional Microstructures by the Anisotropic Etching of (100) and (110) Silicon," *IEEE Transactions of Electron Devices*, vol. Ed. 25, No. 10, Oct. 1978, pp. 1178–1185.
Jackson, T. N. et al., "An Electrochemical P-N Junction Etch-Stop for the Formation of Silicon Microstructures," *IEEE Transactions on Electron Devices*, vol. EDL-2, No. 2, Feb. 1981, pp. 44–45.
Jolly, Richard D. et al., "Miniature Cantilever Beams Fabricated by Anisotropic Etching of Silicon," *J. Electronics Soc.*, vol. 127, No. 12, Dec. 1980, pp. 2750–2754.
Kimura, M., "Microheater and Microbolometer Using Microbridge of $SiO_2$ Film on Silicon," *Electronics Letters*, vol. 17, No. 2, Jan. 22, 1981, pp. 80–82.
Petersen, K. E., "Dynamic Micromechanics on Silicon: Techniques and Devices," *IEEE Transactions on Electron Devices*, vol. Ed. 25, No. 10, Oct. 1978, pp. 1241–1250.
Petersen, K. E., "Micromechanical Light Modulator Array Fabricated on Silicon," *Applied Physics Letters*, vol. 31, No. 8, Oct. 15, 1977, pp. 521–523.

(List continued on next page.)

*Primary Examiner*—William A. Powell
*Attorney, Agent, or Firm*—John P. Sumner

[57] ABSTRACT

A semiconductor device comprising a semiconductor body having a depression formed into the first surface of the body. The device further comprises member means comprising a thermal-to-electric or static electric element, the member means having a predetermined configuration suspended over the depression. The member means is connected to the first surface at least at one location, the depression opening to the first surface around at least a portion of the predetermined configuration. The depression provides substantial physical and thermal isolation between the element and the semiconductor body. In this manner, an integrated semiconductor device provides an environment of substantial physical and thermal isolation between the element and the semiconductor body.

8 Claims, 13 Drawing Figures

OTHER PUBLICATIONS

Petersen, K. E., "Micromechanical Membrane Switches on Silicon," *IBM J. Res. Develop.*, vol. 23, No. 4, Jul. 1979, pp. 376-385.

Pugacz-Muraszkiewicz, I. J., "Detection of Discontinuities in Passivating Layers on Silicon by NaOH Anisotropic Etch," *IBM J. Res. Develop.*, Sep. 1972, pp. 523-529.

Rahnamai, H. et al., "Pyroelectric Anemometers," 1980 International Electron Devices Meeting, Washington, D.C., Dec. 8-10, 1980, pp. 680-684.

Roylance, Lynn M., "A Batch-Fabricated Silicon Accelerometer," *IEEE Transaction on Electron Devices*, vol. Ed. 26, No. 12, Dec. 1979, pp. 1911-1917.

Terry, Stephen C. et al., "A Gas Chromatographic Air Analyzer Fabricated on a Silicon Wafer," *IEEE Transactions on Electron Devices*, vol. Ed. 26, No. 12, Dec. 1979, pp. 1880-1886.

Terry, Stephen C. et al., "A Pocket-Sized Personal Air Contaminant Monitor," 175*th National Meeting of the American Chemical Society*, Mar. 15, 1978.

Teschler, Leland, "Ultraminiature Mechanics," *Machine Design*, Jan. 8, 1981, pp. 112-117.

Van Putten, A. F. P. et al., "Integrated Silicon Anemometer," *Electronics Letters*, vol. 10, No. 21, Oct. 17, 1974, pp. 425-426.

Van Riet, R. W. M. et al., "Integrated Direction-Sensitive Flowmeter," *Electronics Letters*, vol. 12, No. 24, Nov. 25, 1976, pp. 647-648.

METHOD OF MAKING SEMICONDUCTOR DEVICE

This is a division of application Ser. No. 310,345, filed Oct. 9, 1981.

BACKGROUND AND SUMMARY OF THE INVENTION

The present invention relates to integrated semiconductor device technology in the field of sensors and radiant sources of electromagnetic energy. More specifically, the present invention comprises an integrated semiconductor device which provides a new micro environment for applications including sensing. The present semiconductor device, which may be fabricated through batch processing, provides an environment which permits a thermal-to-electric transducer or static electric element to be integrated with a semiconductor circuit chip while having substantially greater thermal and physical isolation from the chip than is possible with conventional emplacements of such components in integrated semiconductor devices. The present invention has applications in areas including flow sensing, detection of combustible gases, humidity sensing, and pressure sensing. However, the present invention is not limited to such applications.

The present invention comprises a semiconductor device and a method for fabricating the semiconductor device.

The semiconductor device comprises a semiconductor body having a depression formed into the first surface of the body. The device further comprises member means comprising a thermal-to-electric transducer or static electric element, the member means having a predetermined configuration suspended over the depression. The member means is connected to the first surface at least at one location, the depression opening to the first surface around at least a portion of the predetermined configuration, the depression providing substantial physical and thermal isolation between the element and the semiconductor body.

In this manner, an integrated semiconductor device provides an environment of substantial physical and thermal isolation between the transducer or element and the semiconductor body.

The method of making such a device comprises the steps of providing a semiconductor body with a first surface having a predetermined orientation with respect to a crystalline structure in the semiconductor body. The method further comprises applying a layer of material of which the member means is comprised onto the first surface. The method also comprises exposing at least one predetermined area of the first surface, the exposed surface area being bounded in part by the predetermined configuration to be suspended, the predetermined configuration being oriented so that undercutting of the predetermined configuration by an anisotropic etch will occur in a substantially minimum time. Finally, the method comprises applying the anisotropic etch to the exposed surface area to undercut the member means and create the depression.

DESCRIPTION OF THE PREFERRED EMBODIMENTS

Figure 1:
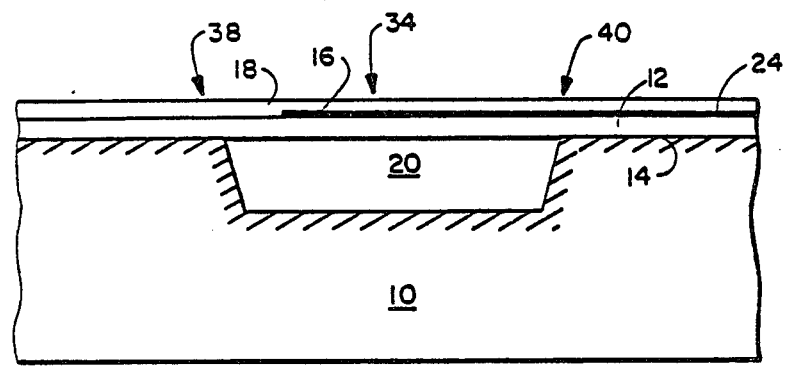
FIGS. 1 through 3 are cross-sectional drawings of preferred embodiments in accordance with the present invention.

The present application describes a variety of inventions. As a result there are described in this application various features and functions which are not the subject of the present invention, but rather are the subject of inventions claimed in the previously mentioned copending applications filed concurrently with this application. The description of these features and functions are included in the present application for the sake of completeness. As previously indicated, the present inventions have applications in areas such as flow sensing, detection of combustible gases, humidity sensing, and pressure sensing. These specific applications will be discussed below, followed by discussions of generic devices and processing steps associated with fabrication of the present structures.

FLOW SENSOR

Thermal anemometry has been for many years a useful tool for the measurement of fluid flow. Thermal anemometers, by definition, depend upon heat transfer for their operation. A resistor with a temperature sensitive resistance is typically placed in the flow stream. Electric current flowing through the resistor causes the resistor to increase in temperature due to electrical power dissipation. The fluid being monitored carries heat away from the resistor via forced convection. The ultimate temperature of the resistor, as indicated by measured resistance, is a function of the fluid's velocity and thermal conductivity. Prior art transducing resistive elements are typically of the hot-wire, hot-film, thermistor type.

The ideal thermal anemometer would be inexpensive yet possess a very fast response resistor/transducer and be accurate and rugged. These requirements are often conflicting, as evidenced by state-of-the-art thermal anemometers. Cheap anemometers are typically comprised of bulky sensing elements which cause a poor response time characteristic. Fast responding anemometers are typically expensive and have fragile sensing elements. Accurate anemometers are typically expensive due to labor intensive assembly of the sensing element and support structure. Morover, state-of-the-art anemometers must be fully inserted into the fluid flow region and, consequently are subject to destruction or deterioration by impacting dust, lint, or other debris.

The present thermal anemometer or flow transducer more closely provides all the features desired in an ideal transducer. The disclosed device is inexpensive, as it can be fabricated by low cost batch processes such as silicon-compatible processes; the device responds with a thermal time constant in the millisecond range; and the accuracy of the device exceeds those of prior solid state thermal anemometers due to an increased sensitivity (greater change in resistance for a given change in flow) and signal to noise ratio. Moreover, its design is such that it need not be fully inserted into the fluid stream. As a result, dust, lint, and debris tend to flow by the sensing element rather than impacting it. The present anemometer is therefore less subject to performance deterioration than state-of-the-art thermal anemometers.

Figure 2:
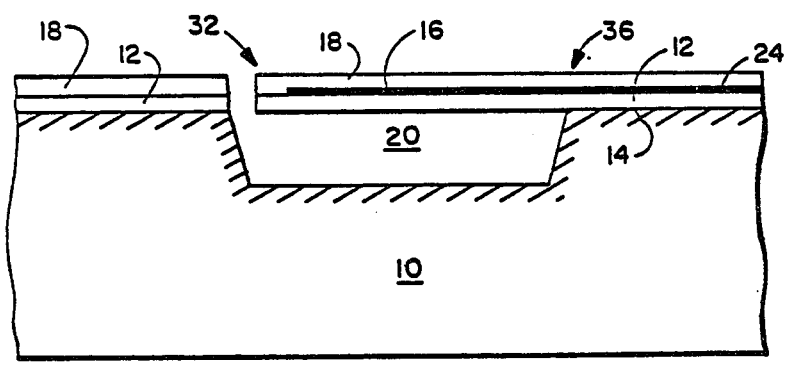

FIGS. 1 and 2 are cross-sectional side views of alternate preferred embodiments of flow sensors in accordance with the present invention. A mono-crystalline semiconductor 10 has a first surface 14 covered with a dielectric layer 12 such as silicon nitride. In the embodiment shown, an element 22 (FIG. 4) comprises a permalloy resistive element or grid 16 and leads 24 sputtered onto dielectric layer 12, element 22 being covered with a layer 18 of dielectric such as silicon nitride.

Dielectric layer 12 provides electrical isolation between element 22 and semiconductor 10 (layers 12 and 18 also provide passivation for element 22). Substantial thermal and physical isolation is provided between resistive element 16 and semiconductor 10 by forming a depression 20 below element 16. Depression 20 is typically formed using preferential etching techniques such as those discussed elsewhere herein. Without depression 20, it would be difficult to achieve substantial thermal and physical isolation between sensing element 16 and semiconductor 10; for example, if resistive element 16 were separated from semiconductor 10 by only a solid dielectric layer, resistive element 16 would be substantially heat-sunk into semiconductor 10 since the thermal conductivities of solid dielectrics are typically much greater than the thermal conductivity of air.

Substantial thermal and physical isolation between sensing element 16 and semiconductor 10 provides many advantages adaptable to a wide variety of devices such as sensors. For example, in the case of the present semiconductor body flow sensor, by providing a very thin sensing means that is substantially thermally isolated from the semiconductor body, the sensing means is adapted to provide a very sensitive measurement of air flow, since the temperature of the thin structure will be readily affected by the air flow. This is in contrast to solid state thermal anemometers that have sensing elements substantially heat sunk into the semiconductor body; the temperature sensitivity of such structures is greatly affected by the thermal mass of the semiconductor itself.

In the embodiment of FIG. 1, member or sensing means 34 is bridged across depression 20, member means 34 having first and second ends 38 and 40 connected to semiconductor first surface 14. As disclosed, member means 34 is substantially rectangular in shape when viewed from above, member means 34 as disclosed comprising resistive element 16 and a portion of dielectric layers 12 and 18.

In the embodiment of FIG. 2, member or sensing means 32, comprising a resistive element 16 and a portion of dielectric layers 12 and 18, is cantilevered over depression 20, only one end 36 of member means 32 being connected to semiconductor first surface 14. Having only one end of member means 32 connected to semiconductor body 10 provides certain advantages, including the advantage of permitting member means 32 to expand and contract in substantially all directions without substantial restraint from semiconductor body 10. In addition, member means 32 provides an embodiment having substantially increased thermal isolation because heat loss by conduction through member means 32 occurs through only one supporting end.

Figure 3:
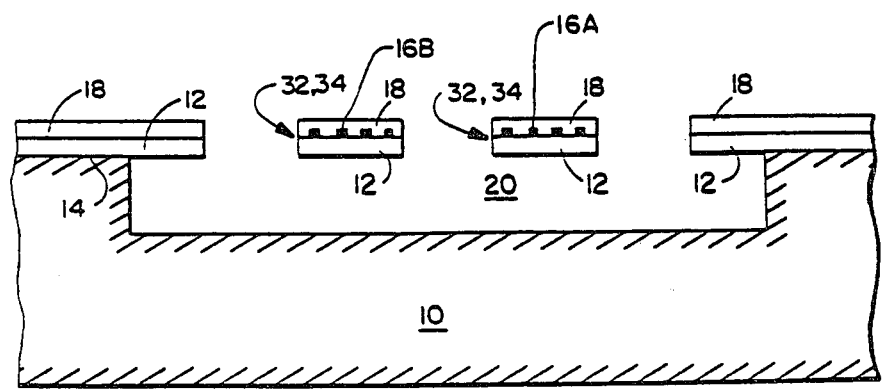

FIG. 3 illustrates an end cross-sectional view of a preferred embodiment comprising two member means 32 or 34 (FIGS. 10-13 illustrate top views of various alternate preferred embodiments). With regard to the present flow sensor, a pair of member means is a preferred embodiment having certain advantages. For example, as is further discussed below, using two substantially identical member means and offsetting a signal from one against a signal from the other can provide automatic temperature compensation for changing environmental temperatures. In addition, such an arrangement can greatly increase measurement accuracy, since background voltage within a single sensor can easily be substantially eliminated. Further, using two measurement elements in a flow sensor provides an indication of flow direction as well as rate, since the upstream element cools more than the downstream element, as is further explained below.

However, a single sensing means supported over depression 20 is consistent with the present flow sensor; for example, for making a flow/no-flow measurement, an air turbulence signal generated in a single-sensing-element flow sensor would be adequate to establish the presence or the absence of air flow. Amplification of only the a.c. (turbulent flow) component of the element resistance change eliminates detection of slow or d.c. changes in element resistance caused, for example, by changing environmental temperature.

For the preferred embodiments shown, permalloy was selected to form resistive element 16 because permalloy can be precisely deposited by sputtering a layer only hundreds of angstroms thick, and because the characteristics of permalloy provide a highly sensitive predetermined relationship between the resistance of grid or element 16 and the temperature of the element. For example, a very thin member or sensing means 32 or 34 may be formed of resistive element 16 and dielectric layers 12 and 18. When applied as a flow sensor, air flowing over member means 32 or 34 will cause resistive element 16 to cool in predetermined relation to the rate of air flow, thus causing a change in resistance and providing a measurement of air flow.

For the embodiments shown, member means 32 and 34 are typically on the order of 0.8-1.2 microns thick, this thickness including element 16 (typically on the order of 800 angstroms thick) and dielectric layers 12 and 18, each typically on the order of thousands of angstroms thick. This very thin and highly sensitive configuration, in combination with the fact that sensing element 16 is substantially isolated from the body of the semiconductor 10 by depression 20 (typically in the range of 0.001 to 0.010 inch deep) causes the sensing means to be highly sensitive to flow measurements.

Figure 4:
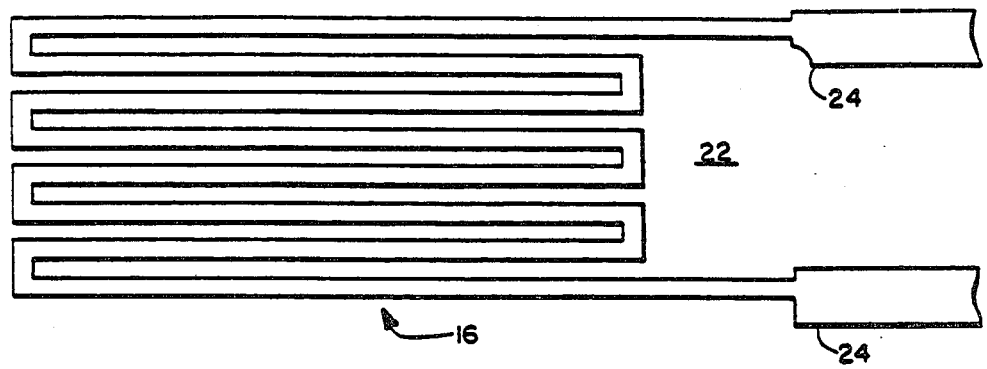
FIG. 4 illustrates an electrically resistive grid compatible with the present invention.

As previously indicated, a preferred embodiment of element 16 comprises a permalloy grid as shown in FIG. 4. Leads 24 may be permalloy since additional processing steps are then avoided (making leads 24 of another material would require additional processing steps; although leads 24 of permalloy become slightly heated, they are relatively wide, as illustrated in FIGS. 4 and 10-13, and they are substantially heat sunk into semiconductor body 10, making heating of leads 24 relatively minor).

As previously indicated, advantages exist in providing a flow transducer comprising first and second resistive elements such as illustrated in FIG. 3. Such an embodiment may be coupled with a circuit such as illustrated in FIG. 5, thus providing a flow transducer which is independent of environmental temperatures and which provides further sensitivity by eliminating background signals and directly providing a measurement signal.

Figure 5:
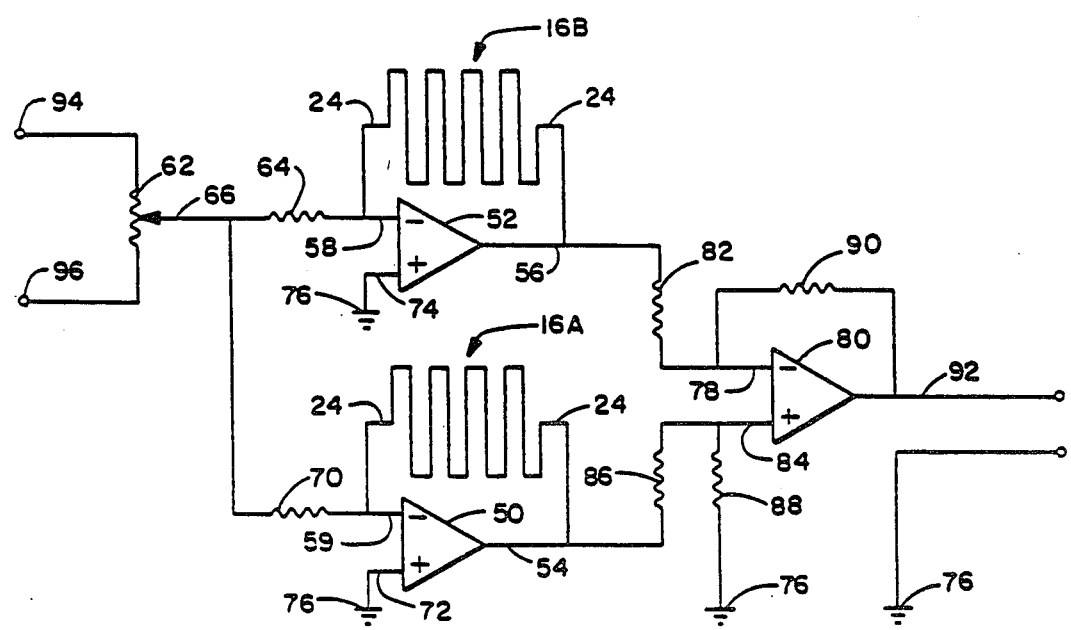
FIG. 5 illustrates circuitry compatible with some preferred embodiments of the present sensor.

For the purpose of discussing the operation of the sensor embodiment illustrated in FIG. 3 and for the purpose of describing the circuit illustrated in FIG. 5, the sensing elements in these figures have been labeled 16A and 16B, each element 16A and 16B comprising an element 16. Elements 16A and 16B are typically matched (at least substantially identical), but they do not have to be matched.

A substantial advantage of the present invention is that circuits such as illustrated in FIG. 5 may be integrated directly onto semiconductor body 10, thus providing a complete sensing system on a single chip through batch processing.

The circuit illustrated in FIG. 5 comprises three differential amplifiers, each of which may comprise, for example, a TL087. As illustrated, each of two amplifiers 50 and 52 have a resistive element 16A or 16B connected across its feedback loop. Thus, resistive element 16A is connected between an output 54 and a negative input 59 of amplifier 50, the connections being made via leads 24 associated with element 16A. Resistive element 16B is connected across an output 56 and a negative input 58 of amplifier 52, the connections again being made with leads 24 associated with element 16B.

Negative input 58 to amplifier 52 is connected to a wiper 66 of a poentiometer 62 through a resistor 64. Negative input 59 to amplifier 50 is connected to wiper 66 through a resistor 70. Positive inputs 72 and 74 of amplifiers 50 and 52 respectively are connected to ground or reference potential 76.

Output 56 of amplifier 52 is connected to a negative input 78 of amplifier 80 through a resistor 82, output 54 of amplifier 50 being connected to a positive input 84 to amplifier 80 through a resistor 86. Positive input 84 of amplifier 80 is also connected to ground or reference potential 76 through a resistor 88. A resistor 90 is connected between an output 92 of amplifier 80 and negative input 78 of the amplifier.

A first terminal 94 of potentiometer 62 is provided for connection to a positive power supply such as +15 VDC, a second terminal 96 of potentiometer 62 being provided for connection to a negative power supply such as −15 VDC. Potentiometer 62 provides a means for selecting a predetermined voltage anywhere between the plus and minus voltage of the power supply.

In operation, the disclosed circuit generates a voltage between output 92 and ground or reference potential 76 that bears a predetermined relationship to gas flow rate over member means 32 or 34 comprising resistive elements 16A or 16B.

Resistive elements 16A and 16B are configured into the feedback loops of amplifiers 50 and 52, respectively. Each operational amplifier 50 and 52 maintains constant current through its feedback loop. Therefore, the electrical current flowing through each resistive element 16A and 16B is independent of the element resistance. In order to maintain constant current in its feedback loop, each operational amplifier in effect changes its output voltage in proportion to the change in resistance of resistive elements 16A or 16B. As previously indicated, the resistance of each permalloy element 16A or 16B changes in a predetermined manner with the temperature of the resistive element. Therefore, the voltage output of each operational amplifier 50 and 52 bears a predetermined relationship to the associated resistive element temperature.

Operational amplifier 80 amplifies the difference between the voltage outputs of operational amplifiers 50 and 52, the voltage at output 92 being proportional to the difference in voltage between the output voltages of operational amplifiers 50 and 52. Accordingly, the voltage at output 92 bears a predetermined relationship to the temperature difference between resistive elements 16A and 16B. The temperature difference between resistive elements 16A and 16B bears a predetermined relationship to the gas flow rate over the elements. Therefore, the voltage at output 92 of amplifier 80 bears a predetermined relationship to the rate of flow across elements 16A and 16B.

Gas flowing first over one member or sensing means comprising resistive element 16A and then over a second member or sensing means comprising element 16B causes resistive element 16A to cool more than resistive element 16B, since the gas flowing over element 16A picks up heat from element 16A and carries heat to the vicinity of element 16B. Assuming that the circuit supply voltage at wiper 66 is positive, this causes the output voltage of amplifier 52 to be greater than the output voltage of amplifier 50. This difference is magnified by amplifier 80, the output voltage at output 92 bearing a predetermined relationship to the rate of gas flow. As previously indicated, the output voltage at output 92 can also provide an indication of directionality. For example, if elements 16A and 16B are aligned along the flow in a duct, the present two-element sensor can be used to determine direction of flow as well as flow rate, since the upstream element will cool more than the downstream element, as explained above.

As indicated, the circuit illustrated in FIG. 5 operates sensing elements 16A and 16B in a constant current mode. It should be noted that other circuits are also possible, including circuits which would operate sensors 16A and 16B (or any of the present sensors) in a constant voltage mode, a constant temperature (constant resistance) mode, or a constant power mode.

HUMIDITY SENSOR

The present invention also has applications as a humidity sensor. In such applications, the present sensor can measure atmospheric water vapor concentration or relative humidity independently of surface adsorption effects and independently of optical effects and does this at very low cost on a semiconductor chip compatible with signal processing integration.

The present humidity sensor depends upon the variation of thermal conductivity of air as the water vapor concentration varies. Water vapor concentration here is defined as the ratio of the number of water vapor molecules per unit volume to the number of molecules of dry air per unit volume. This concentration is sometimes referred to as molal humidity which is related to specific humidity by the constant ratio of the molecular weight of water to the average molecular weight of dry air.

Accordingly, the present humidity sensor provides a direct indication of molal humidity which may be converted to specific humidity through a circuit (not shown) providing an appropriate multiplier to the molal humidity measurement.

It may also be of interest to convert molal humidity measurements to measurements of relative humidity. Such a conversion requires a measurement of ambient temperature and requires that a corresponding automatic adjustment be made according to standard psychrometric chart data. An appreciable altitude effect caused by air mixture density variation is also involved in a conversion to relative humidity because, for any given mole fraction of water vapor measured by thermal conductivity, the partial pressure of the water vapor will vary with altitude. Consequently, for the most accurate relative humidity measurement, the conversion must be adjusted slightly by an altitude-dependent factor. Such conversions may be made by circuitry (not shown).

Environmental control applications may require a device readout in terms of air mixture enthalpy referred to the enthalpy at some lower reference temperature and zero humidity. Enthalpy varies linearly with temperature at constant molal humidity and linearly with molal humidity at constant temperature in ranges of interest that exclude freezing and condensation. Therefore, an enthalpy determination can be obtained from a molal humidity measurement and the air mixture temperature by a circuit (not shown) that yields a readout offset for dry air proportional to the difference between mixture temperature and reference temperature, and which calibrates the molal humidity output to an enthalpy scale.

Figure 6:
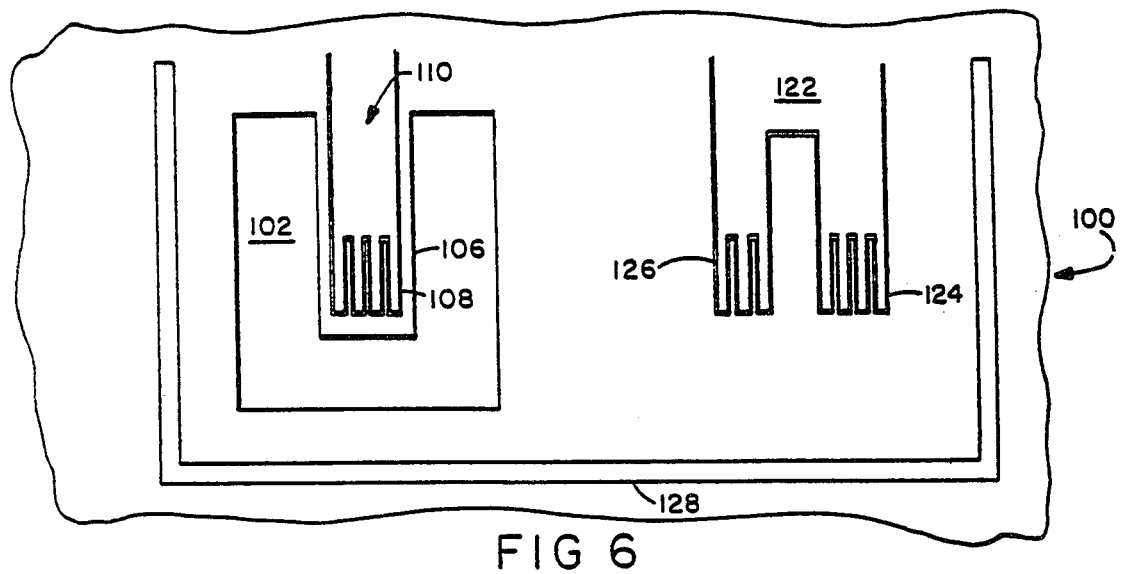
FIGS. 6–8 illustrate a sensor in accordance with the present invention.

In its simplest form, the present humidity sensor comprises a semiconductor body 100 having a depression 102 etched or otherwise formed into a first surface 104 of the body. The present humidity sensor further comprises member means such as 106 which may be either bridged across depression 102 in the manner of member means 34 shown in FIG. 1, or may be of a cantilever configuration as shown in FIGS. 2 and 6. Member means 106 typically comprises a resistive element such as 108, member means 106 having a predetermined configuration suspended over the depression, the member means being connected to first surface 104 at least at one location such as location 110. Depression 102 opens to first surface 104 around at least a portion of the predetermined configuration of member means 106.

Resistive element 108, when provided with current, becomes heated, there being a predetermined relationship between the resistance and the temperature of resistive element 108.

Figure 8:
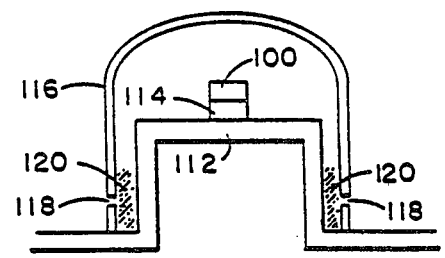

The present humidity sensor further comprises no-flow means 116, FIG. 8, for substantially preventing air flow over member means 106, thus substantially preventing cooling of resistive element 108 due to air flow. The no-flow means permits the humidity level to equalize between member means 106 and semiconductor body 100 with the humidity level in the surrounding environment, the no-flow means example 116 containing apertures 118 for this purpose. Also shown are filters 120 to prevent the present sensor from becoming contaminated by air-borne particulates.

Resistive element 108 is adapted to provide a signal having a magnitude related to the resistance and, therefore, the temperature of element 108, the magnitude of the signal varying with humidity due to varying thermal coupling between element 108 and semiconductor body 100 through depression 102, the varying thermal coupling arising through the varying conductivity of air with varying molal humidity, the signal thus providing a measurement of humidity.

In a typical application of the present humidity sensor, semiconductor body or chip 100 is mounted with epoxy to a glass member 114, which in turn is mounted to a header 112. The glass member substantially thermally isolates substrate 100 from the header. The header typically comprises feedthroughs (not shown) in order to connect a wire bonded structure for making electrical connections.

Figure 7:
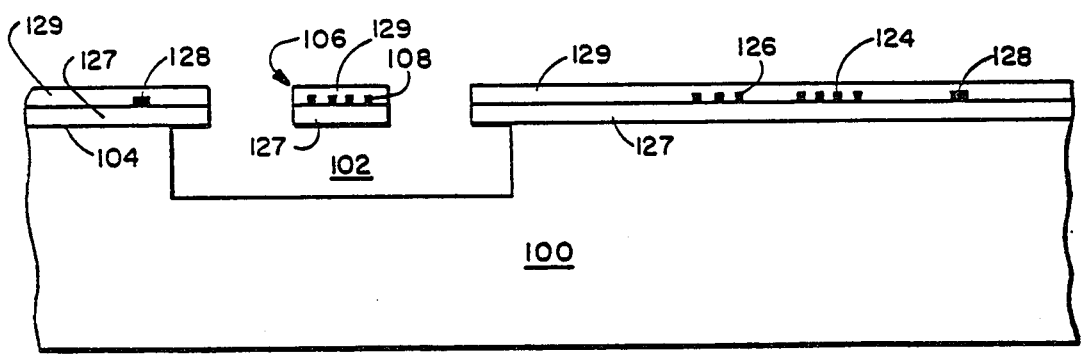

The present humidity sensor may also comprise reference resistor means 122 comprising a resistive element 124. As further discussed below, the present humidity sensor may further comprise series resistor means 126 having a substantially zero thermal coefficient of resistance (TCR) over a predetermined temperature range of interest. As shown in FIG. 7 and explained below, series resistor means 126 may be connected in series with resistive element 124; alternately, series resistor means 126 may be connected in series with resistive element 108. As examples, series resistor means 126 may comprise a chrome silicide or a nichrome element.

The present humidity sensor may further comprise heater means comprising an element 128 for controlling the temperature of semiconductor body 100 to a predetermined temperature. Element 128 may comprise a resistive element such as a permalloy element substantially heat sunk to the semiconductor body.

Like resistive element 108, resistive element 124 may comprise a permalloy grid not unlike that shown in FIG. 4. As such, element 124 may serve not only as a reference resistor for element 108 but also as a temperature measuring sensor for element 124 and/or for thermostated semiconductor body 100, the permalloy having a predetermined relationship between temperature and resistance. Thus, semiconductor body 100 can be maintained at a predetermined elevated temperature by regulating current through resistive element 128 and monitoring the temperature of body 100 with element 124.

As disclosed, elements 108, 124, 126, and 128 are sandwiched between two layers of dielectric such as silicon nitride, a first layer 127 also covering at least a portion of first surface 104, and a second layer 129.

With a permalloy element 124 substantially heat sunk to semiconductor body 100, the temperature of element 124 is substantially regulated by the temperature of the semiconductor body. Further, since element 124 is substantially thermally coupled to semiconductor body 100, the resistance of element 124 does not substantially vary with varying humidity. Accordingly, a signal from element 124 may be offset by a signal from element 108, thus effectively providing a resulting signal that under predetermined conditions of specific humidity will have a predetermined value. A circuit substantially as shown in FIG. 5 may be used to attain such a result, elements 16A and 16B of FIG. 5 being replaced with elements 108 and 124 of the humidity sensor, and element 126 being put in series with either element 108 or 124 as appropriate.

The temperature versus resistance curves of permalloy elements are nonlinear. Thus, the temperature versus resistance curve of element 108 will have a first predetermined slope when operating at a first predetermined operating temperature. The resistance of element 124 may then be established so that, at a second predetermined temperature, e.g., typically the thermostated temperature of chip or body 100 as measured by element 124, the temperature versus resistance curve of element 124 has a slope substantially equal to the first predetermined slope of element 108 at its operating temperature. The total effective resistance of element 108 or 124, as appropriate, may then be adjusted by adding series resistor means 126 in series with either element 108 (this arrangement is not shown) or 124 (as shown), series resistor means 126 having a substantially zero thermal coefficient of resistance over the temperature range of interest. As a result, the total effective resistance of the reference element may be made to be substantially equal at the second predetermined temperature to the total effective resistance of the humidity sensing element at the first predetermined temperature. In this manner, when the effective resistance of the reference and humidity sensing elements are substantially equal, signals through the two elements may be offset so that at a predetermined humidity the sum of the signals will be substantially zero. Again, this can be accomplished with a circuit substantially as that shown in FIG. 5.

COMBUSTIBLE GAS SENSOR

Figure 9:
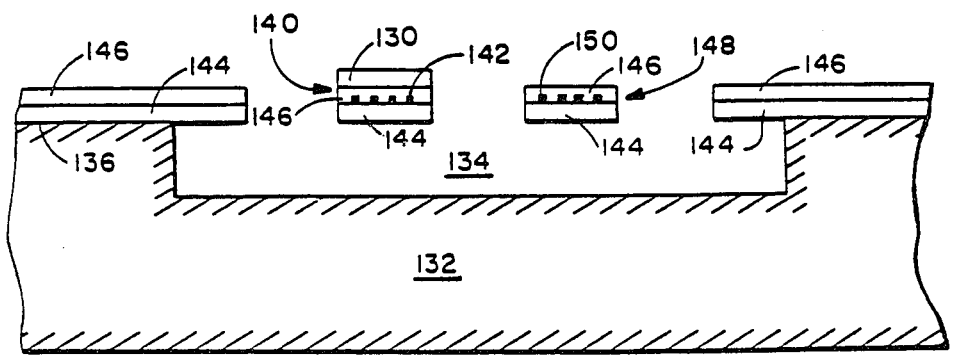
FIG. 9 illustrates a combustible gas sensor in accordance with the present invention.

As previously indicated, the present invention also has applications as a sensor for detecting combustible gas. The present combustible gas sensor as disclosed in FIG. 9 is quite similar to the flow sensor as disclosed in FIG. 3 except that a reactive means 130 is thermally coupled to one of the resistive elements. When heated in the presence of a combustible gas and oxygen, reactive means 130 provides an indication of the presence of a combustible gas. In addition, a no-flow means such as no-flow means 116 used with the present humidity sensor is also used to substantially prevent air flow over the first and second member means of the embodiment shown.

In FIG. 9, reactive means 130 is shown thermally coupled to resistive element 142 within member means 140. In one preferred embodiment of the present combustible gas sensor, reactive means 130 typically comprises a catalytically reactive thin film of, for example, iron oxide, platinum, or palladium which is heated by resistive element 142. In such an embodiment, the catalytically reactive thin film, when heated in the presence of a combustible gas and oxygen, causes an exothermic reaction which changes the temperature and, accordingly, the resistance of its corresponding resistive element 142. Thus, the change in temperature of resistive element 142 due to the exothermic reaction provides a change in the resistance of the element indicating the presence of a combustible gas.

In an alternate preferred embodiment of the present combustible gas sensor, reactive means 130 may comprise a metal oxide resistive element of, for example, iron oxide or tin oxide which is heated by resistive element 142 (the metal oxide resistive element may be configured similar to element 16 shown in FIG. 4). In such an embodiment, the metal oxide resistive element changes in resistance when heated by resistive element 142 in the presence of a combustible gas and oxygen, thus indicating the presence of a combustible gas.

More specifically, the present sensor for detecting combustible gas comprises a semiconductor body 132 having a depression 134 etched or otherwise formed into a first surface 136 of the semiconductor body or chip 132.

The present sensor further comprises member means 140 which may be either bridged across depression 134 in the manner of member means 34 shown in FIG. 1, or may be of a cantilever configuration such as member means 32 shown in FIG. 2. The member means typically comprises a resistive element such as 142 which may comprise a permalloy grid such as shown in FIG. 4. Member means 140 has a predetermined configuration suspended over depression 134, member means 140 being connected to first surface 136 at least at one location. Depression 134 opens to first surface 136 around at least a portion of the predetermined configuration of member means 140. Member means 140 provides substantial physical and thermal isolation between element 142 and semiconductor body 132. As previously indicated, member means 140 further comprises reactive means 130 thermally coupled to resistive element 142.

Resistive element 142 when provided with current becomes heated, there being a predetermined relationship between the resistance and the temperature of resistive element 142.

As also previously indicated, the present combustible gas sensor also employs no-flow means such as no-flow means 116 shown in FIG. 8, the no-flow means substantially preventing air flow over member means 140, thus substantially preventing cooling of resistive element 142 due to air flow. The no-flow means permits access of combustible gas to reactive means 130 by, for example, apertures such as 118 shown in FIG. 8.

As previously indicated, in a first preferred embodiment of the present combustible gas sensor, reactive means 130 typically comprises a catalytically reactive thin film. In such an embodiment, reactive means 130 when heated by resistive element 142 in the presence of a combustible gas and oxygen causes an exothermic reaction, thus causing a change in temperature and, accordingly, resistance of resistive element 142. This change in resistance of resistive element 142 indicates the presence of a combustible gas. In a second preferred embodiment, reactive means 130 typically comprises a metal oxide resistive element. In such an embodiment, resistive element changes resistance when heated by resistive element 142 in the presence of a combustible gas and oxygen, thus indicating the presence of a combustible gas.

As disclosed, resistive element 142 is encapsulated in two layers of dielectric such as silicon nitride, a first layer 144 also covering at least a portion of first surface 136, and a second layer 146. As shown, reactive means 130 is deposited above dielectric layer 146 on member means 140.

If the first preferred embodiment of the present combustible gas sensor is used, it may be desirable to employ a second resistive element 150 embodied in a second member means 148. As disclosed, a second member means 148 has a predetermined configuration suspended over depression 134, second member means 148 being connected to first surface 136 at least at one location, depression 134 opening at first surface 136 around at least a portion of the predetermined configuration of member means 148. Depression 134 provides substantial physical and thermal isolation between second resistive element 148 and semiconductor body 132.

Except that member means 148 is without reactive means such as 130, member means 140 and 148 may be substantially identical. Member means 148 including its resistive element 150 may then be used as a reference element having substantially the same reaction to changes in ambient temperature as member means 140, thus providing automatic temperature compensation. Further, the signal from reference element 150 may be offset against the signal from sensing element 142, thus substantially eliminating background signal levels and obtaining a direct measurement of the signal caused by the change in temperature introduced by reactive means 130. Substantially the same circuit as shown in FIG. 5 may be used to accomplish this, elements 142 and 150 replacing elements 16A and 16B shown in the Figure.

PRESSURE SENSOR

The present invention also has applications as a pressure sensor, typically as a sensor for measuring sub-atmospheric pressures. A need exists for a pressure sensor covering a relatively wide dynamic range. For example, general industrial processes employing various gases such as oxygen, argon, nitrogen, and hydrogen at varying temperatures and pressures frequently require the measurement of pressure as part of process control.

Conventional tungsten-heated thermal conductivity pressure sensors in the sub-atmospheric pressure range are unsatisfactory because of a relatively low dynamic range, high power and voltage requirements, fragility, relatively low sensitivity (because of low thermal coefficient of resistance) and low life (tungsten readily oxidizes when the oxygen partial pressure increases faster than cooling time constant of the heated tungsten). The present pressure sensor eliminates or reduces the severity of these shortcomings.

The present pressure sensor depends upon the variation of thermal conductance of a gas volume. More specifically, as mean free path lengths become limited by the distance between a member means such as 106 and a semiconductor substrate such as 100 below it, thermal conductivity and heat removal rate from the member means decreases with decreasing gas pressure. This leads to a temperature increase of a resistive element such as 108 in the member means, assuming that the resistive element is being operated with a constant current.

The present pressure sensor may be constructed substantially like the present humidity sensor, and the same Figures as used to describe the present humidity sensor will also be used to describe the present pressure sensor.

In its simplest form, the present pressure sensor comprises a semiconductor body 100 having a depression 102 etched or otherwise formed into a first surface 104 of the body. The present pressure sensor further comprises member means such as 106 which may be either bridged across depression 102 in the manner of member means 34 shown in FIG. 1, or may be of a cantilever configuration as shown in FIGS. 2 and 6. Member means 106 typically comprises a resistive element 108, member means 106 having a predetermined configuration suspended over the depression, the member means being connected to first surface 104 at least at one location such as location 110. Depression 102 opens to first surface 104 around at least a portion of the predetermined configuration of member means 106.

Resistive element 108, when provided with current, becomes heated, there being a predetermined relationship between the resistance and the temperature of resistive element 108.

The present pressure sensor further comprises no-flow means 116, FIG. 8, for substantially preventing air flow over member means 106, thus substantially preventing cooling of resistive element 108 due to air flow. The no-flow means permits the pressure level to equalize between member means 106 and semiconductor body 100 with the pressure level in the surrounding environment, the no-flow means example 116 containing apertures 118 for this purpose. Also shown as filters 120 to prevent the present sensor from becoming contaminated by air-borne particulates.

Resistive element 108 is adapted to provide a signal having a magnitude related to the resistance and, therefore, the temperature of element 108, the magnitude of the signal varying with sub-atmospheric pressure due to varying thermal coupling between element 108 and semiconductor body 100 through depression 102, the varying thermal coupling arising through the varying conductivity of air with varying pressure, the signal thus providing a measurement of pressure.

In a typical application of the present pressure sensor, semiconductor body or chip 100 is mounted with epoxy to a glass member 114, which in turn is mounted to a header 112. The glass member substantially thermally isolates substrate 100 from the header. The header typically comprises feed throughs (not shown) in order to connect a wire bonded structure for making electrical connections.

The present pressure sensor may also comprise reference resistor means 122 comprising a resistive element 124. As was discussed in association with the present humidity sensor, the present pressure sensor may further comprise series resistor means 126 having a substantially zero thermal coefficient of resistance (TCR) over a predetermined temperature range of interest. As shown in FIG. 7, series resistor means 126 may be connected in series with resistive element 124; alternately, series resistor means 126 may be connected in series with resistive element 108. As examples, series resistor means 126 may comprise a chrome silicide or a nichrome element.

The present pressure sensor may further comprise heater means comprising an element 128 for controlling the temperature of semiconductor body 100 to a predetermined temperature. Element 128 may comprise a resistive element such as a permalloy element substantially heat sunk to the semiconductor body.

Like resistive element 108, resistive element 124 may comprise a permalloy grid not unlike that shown in FIG. 4. As such, element 124 may serve not only as a reference resistor for element 108 but also as a temperature measuring sensor for element 124 and/or for thermostated semiconductor body 100, the permalloy having a predetermined relationship between temperature and resistance. Thus semiconductor body 100 can be maintained at a predetermined elevated temperature by regulating current through resistive element 128 and monitoring the temperature of body 100 with element 124.

As disclosed, elements 108, 124, 126, and 128 are sandwiched between two layers of dielectric such as silicon nitride, a first layer 127 also covering at least a portion of first surface 104, and a second layer 129.

With a permalloy element 124 substantially heat sunk to semiconductor body 100, the temperature of element 124 is substantially regulated by the temperature of the semiconductor body. Further, since element 124 is substantially thermally coupled to semiconductor body 100, the resistance of element 124 does not substantially vary with varying pressure. Accordingly, a signal from element 124 may be offset by a signal from element 108, thus effectively providing a resulting signal that under predetermined conditions of pressure will have a predetermined value. A circuit substantially as shown in FIG.

5 may be used to obtain such a result, elements 16A and 16B of FIG. 5 being replaced with elements 108 and 124 of the present pressure sensor, and element 126 being put in series with either element 108 or 124 as appropriate.

The temperature versus resistance curve of permalloy elements are nonlinear. Thus, the temperature versus resistance curve of element 108 will have a first predetermined slope when operating at a first predetermined operating temperature. The resistance of element 124 may then be established so that, at a second predetermined temperature, e.g., typically the thermostated temperature of chip or body 100 as measured by element 124, the temperature versus resistance curve of element 124 has a slope substantially equal to the first predetermined slope of element 108 at its operating temperature. The total effective resistance of element 108 or 124, as appropriate, may then be adjusted by adding series resistor means 126 in series with either element 108 (this arrangement not shown) or 124 (as shown), series resistor means 126 having a substantially zero thermal coefficient of resistance over the temperature range of interest. As a result, the total effective resistance of the reference element may be made to be substantially equal at the second predetermined temperature to the total effective resistance of the pressure sensing element at the first predetermined temperature. In this manner, when the effective resistance of the reference and pressure sensing elements are substantially equal, signals through the two elements may be offset so that at a predetermined pressure the sum of the two signals will be substantially zero. Again this can be accomplished with a circuit substantially as shown in FIG. 5.

Although the present pressure sensor has been described in such a manner that it could be sensitive to changing humidity levels, this is not considered to be a problem for typical applications since over the useful range of the present pressure sensor the response to changing pressure is large compared with a response to changing humidity.

When one first considers the phenomena related to the present pressure sensor, one might think that as the pressure of a gas decreases, i.e., as the density of the gas decreases, there should be fewer molecules to transport the heat away from a heated member means comprising a resistive element. Thus, with a constant current in the resistive element, if there were fewer molecules, it would seem that the member means would always run hotter as pressure decreases. Such is the case, however, only if the mean free path length of the molecules is an appreciable fraction of the dimension between the member means and the semiconductor body.

For pressures at which the mean free path length is short by comparison to the distance between the member means and the semiconductor body, the rate of heat transport away from the member means does not appreciably change with the changing pressure. Although a change in pressure, e.g., by 10%, causes the gas density to go down by a corresponding amount, the mean free path and, in fact, all path lengths of every category, go up by exactly the same amount, e.g., 10%, in order to compensate. Thus, for pressures at which the mean free path length is short by comparison to the distance between the member means and the semiconductor body, one can make the close approximations that molecules stop when they hit, and that the rate of heat transport away from the member means remains the same since, although there are fewer molecules, they go 10% further without being stopped. This is a very accurate dependency or compensation factor as long as the mean free path length of the gas molecules is short compared to the distance between the member means and the semiconductor body below it.

Accordingly, the present pressure sensor will not typically be sensitive to pressures near normal atmospheric pressures, e.g., in the range of one atmosphere to 0.1 atmosphere.

GENERIC DEVICE AND PROCESSING

In terms of a particular preferred embodiment, it can be seen from the preceding examples that a permalloy resistive element acting as a heater and temperature sensor, in combination with the microstructure disclosed, is a generic invention that provides the basis for sensing many physical variables such as air flow, humidity, pressure, combustible gases and other gaseous species. In fact, any physical quantity whose variation can cause a temperature change in a material structure can in principle be detected by means of a sensor based on structure such as disclosed.

Further, member means comprising, for example, a static electric element such as those disclosed can serve not only as a thermal-to-electric transducing element for the purpose of sensing but also as, for example, an electric-to-thermal element for providing electromagnetic radiation or otherwise serving as a source of thermal energy. Of course, such generic devices are not limited to having a permalloy resistive element, since any suitable thermal-to-electric or static electric element would suffice. Alternate examples of elements include a pyroelectric material such as a zinc oxide mono-crystalline film, a thin film thermocouple junction, a thermister film of semiconducting material, or a metallic film other than permalloy with a favorable temperature coefficient of resistance.

Therefore, described more generally than in the specific examples preceding, and using the structure shown in FIGS. 1 through 4 as illustrative, the present invention comprises a semiconductor body 10 having a depression 20 etched or otherwise formed into a first surface 14 of the body. The present invention further comprises member means 32 or 34 having a thermal-to-electric transducer or static electric element such as 16, the member means having a predetermined configuration suspended over depression 20, the member means being connected to first surface 14 at least at one location. The depression opens to first surface 14 around at least a portion of the predetermined configuration of the member means. The depression provides substantial physical and thermal isolation between the transducer or element and the semiconductor body.

Such an integrated semiconductor device can be fabricated through batch processing as further described below and provides an environment of substantial physical and thermal isolation between the transducer or element and the semiconductor body.

Fabrication of such a device in accordance with the present invention comprises providing a semiconductor body with a first surface having a predetermined orientation with respect to a crystalline structure in the semiconductor body and applying a layer of material of which the member means is comprised onto the first surface. The present invention further comprises exposing at least one predetermined area of the first surface, the exposed surface area being bounded in part by the predetermined configuration to be suspended, the predetermined configuration being oriented so that undercutting of the predetermined configuration by an anisotropic etch will occur in a substantially minimum time.

The preferred implementation of the present invention comprises providing a (100) silicon wafer surface 14 which receives a layer of silicon nitride 12 typically 3000 angstroms thick that is deposited by standard sputtering techniques in a low pressure gas discharge. Next, a uniform layer of permalloy, typically 80 percent nickel and 20 percent iron and 800 angstroms thick, is deposited on the silicon nitride by sputtering.

Using a suitable photo mask, a photoresist, and a suitable etchant, the permalloy element 22 comprising grid 16 and leads 24 are delineated.

A second layer 18 of silicon nitride, typically 5000 angstroms thick, is then sputtered-deposited to provide complete step coverage of the permalloy configuration and thus protect the resistive element and its connections from oxidation. (Although making the first layer of silicon nitride 3000 angstroms thick and the second layer of silicon nitride 5000 angstroms thick results in a member means having non-symmetrical layers of dielectric, such lack of symmetry may be corrected by making the layers of equal thickness.) Openings 152 (FIGS. 10–13) are then etched through the nitride to the (100) silicon surface in order to delineate each member means. (Note that, although the member means are shown having straight edges, such configurations could be varied by, for example, having curved edges.)

Finally, an anisotropic etchant that does not attack the silicon nitride is used to etch out the silicon in a controlled manner from beneath the member means (KOH plus isopropyl alcohol is a suitable etchant). The sloping sides of the etched depression are bounded by (111) and other crystal surfaces that are resistive to the etchant, and the bottom of the depression, a (100) surface, which is much less resistant to the etchant, is located a specified distance (e.g., 0.004 inch) from the member means, typically by adjusting the duration of the etch. A doped silicon etch stop, e.g., a boron-doped layer, may also be used to control the depth of the depression, although such stops are not typically necessary when using the present invention.

In order to obtain undercutting of the member means in a minimum amount of time, the predetermined configuration of the member means, e.g., typically the straight edges or an axis of the member means, are oriented at a non-zero angle 154 to the [110] axis of the silicon (while the present invention will typically involve placing a straight member means edge or axis at an angle to minimize undercutting time [or permit undercutting, in the case of bridged member means], it is conceivable that a member means could be shaped such that no straight edges are involved or that no axis is easily defined but that the configuration itself is still oriented to achieve, for example, minimum undercutting time). By making such an angle substantially 45 degrees, the member means will be undercut in a minimum amount of time. For example, using the 45 degree angle, a cantilever beam of the typical dimensions disclosed elsewhere herein can be undercut in about 90 minutes by comparison to an etch time of several hours using a zero degree orientation.

In addition to minimizing the amount of time in which the member means will be undercut, using a non-zero orientation permits fabrication of two ended bridges such as disclosed in FIG. 1. Such member means are substantially impossible to make with the member means edges being oriented substantially with the [110] direction. This is because an anisotropic etch will not appreciably undercut at inside corners such as 160 or at the (111) crystal planes exposed along the edges of the member means if the edges of member means are oriented with the [110] direction (the [110] oriented cantilevered member means taught in the prior art etch primarily along the length of the beam from the free end of the cantilever, there being little if any undercutting from the edges of the cantilever beam; this is in contrast to formation of member means through the present invention which, as previously explained, results in undercutting from directions including the edges of the member means).

The 45° orientation also permits rapid rounding and smoothing of the semiconductor end support interface with the member means, thus avoiding a stress concentration point that otherwise occurs where two (111) planes intersect beneath dielectric layer 12 (FIGS. 1–3).

Figure 12:
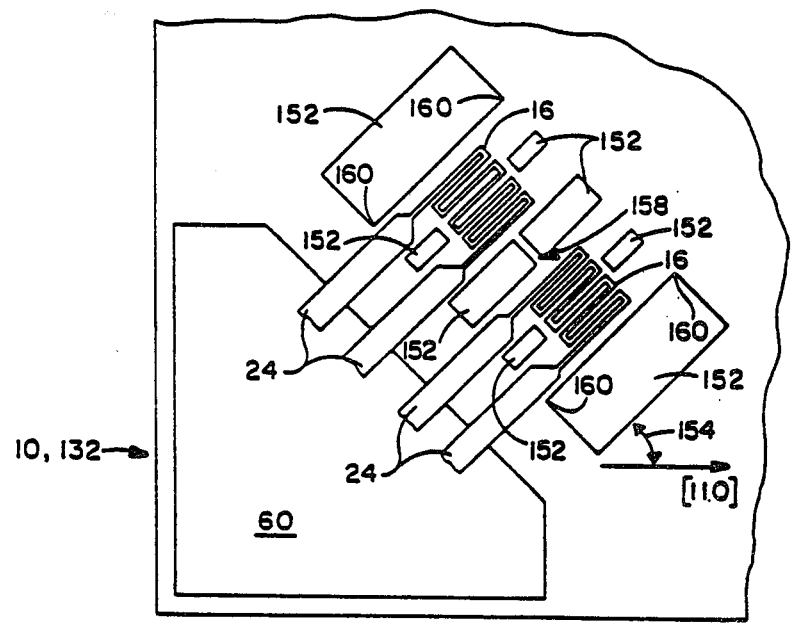

It may be desirable in some device applications to connect first and second member means by a connecting means, thus in a sense providing first and second elements on a single member means. Examples of such connecting means are 156 shown in FIG. 10 connecting two cantilevered member means such as shown in FIG. 2, and connecting means 158 as shown in FIG. 12 connecting two bridge-type member means of the type shown in FIG. 1. Such connecting means help to maintain uniformity of spacing and, therefore, thermal conductance between each member means and the bottom of the depression, thus contributing to the uniformity of performance within each type of device. For similar reasons, it may be of advantage to place two elements on a single member means as shown by way of example in FIG. 13.

Figure 10:
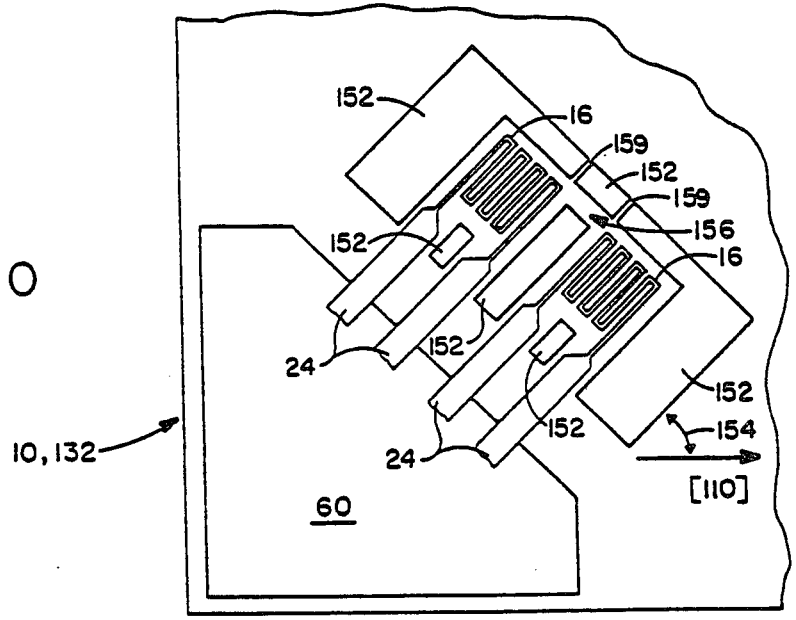
FIGS. 10–13 illustrate orientation and alternate preferred embodiments of microstructure detail compatible with the present invention.

It may also be desirable in some applications, either for processing or device configuration, to connect the member means to the semiconductor body at secondary locations such as locations 159 shown in FIG. 10.

Figure 11:
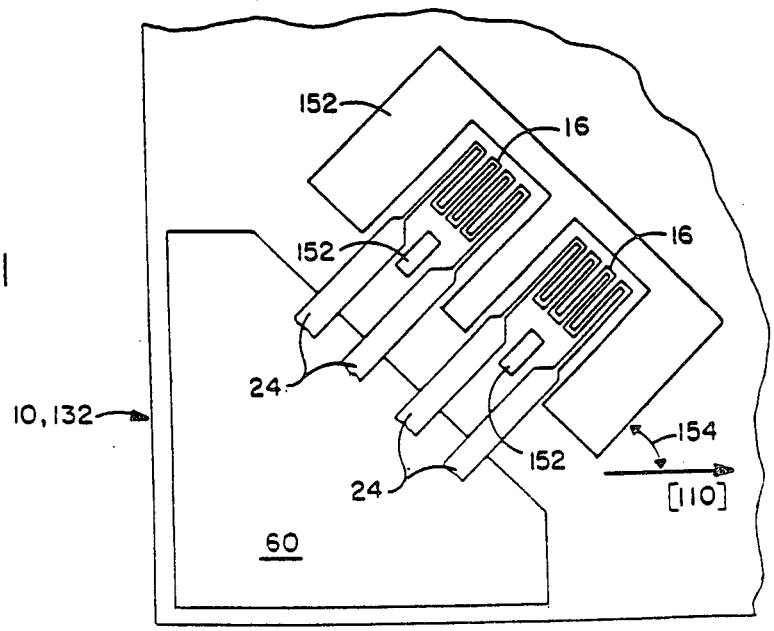
Figure 13:
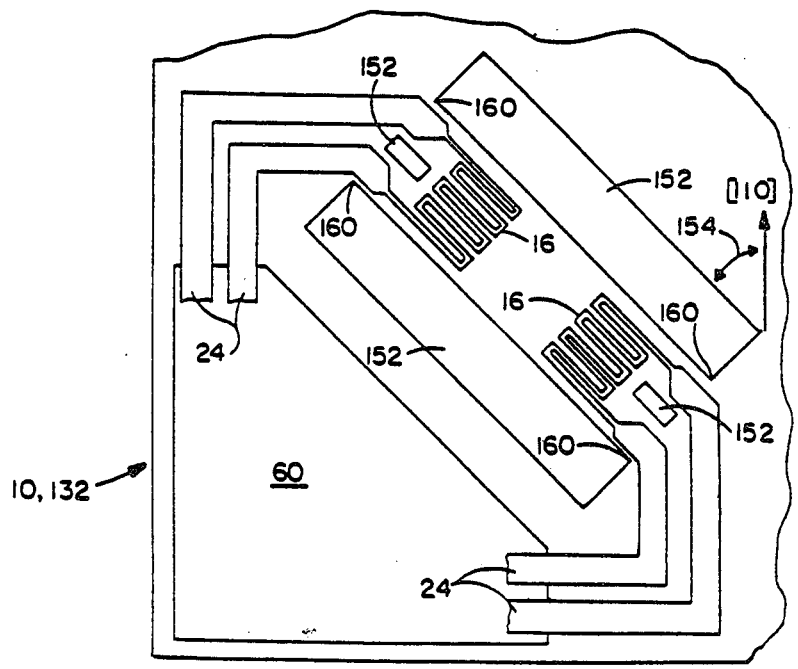

Small rectangular etch holes 152 shown at the single connecting end of the cantilever-type member means shown in FIGS. 10 and 11 and at both ends of the bridge-type member means shown in FIGS. 12 and 13 help to provide further undercutting and forming of the semiconductor body where the member means are attached. However, such holes 152 at the ends of member means are not necessary to satisfactory performance of the devices.

Etch holes 152 running along side the member means shown have typical widths on the order of 0.002 inch to 0.005 inch for flow sensor and combustible gas sensor applications, the width of such apertures being on the order of 0.001 inch for typical humidity and pressure sensor applications, the narrower humidity sensor and pressure sensor width helping to reduce gas flow effects.

The semiconductor bodies in FIGS. 10–13 are indicated as alternately being either flow sensor configurations or combustible gas sensor configurations, the semiconductor bodies being alternately labeled 10 or 132. Layouts for humidity and pressure sensors, e.g., in accordance with FIG. 6, would be similar, there typically being, however, only a single element and member means suspended over a depression in a humidity sensor.

FIGS. 10–13 also show a region 60 for integration of circuitry such as that illustrated in FIG. 5.

As has previously been indicated, the practical effectiveness of the present invention for sensing by thermal means is achieved by making an air gap such as 20 (FIG. 1) underneath member means 32 or 34. The result is that the sensing material is substantially thermally and physically isolated from the substrate by the air gap and is typically supported, as in the disclosed embodiments, by a rectangular area of dielectric which remains attached at one or both ends to the silicon substrate (as previously indicated, although rectangular member means are typically used, virtually any other configuration could be used).

For the embodiments shown, typical dimensions of member means such as 32 or 34 are 0.005 inch–0.007 inch wide, 0.010–0.020 inch long, and 0.8–1.2 microns thick. Typical permalloy elements such as element 16 illustrated in FIG. 4 have a thickness of approximately 800 angstroms (typically in the range of approximately 800 angstroms to approximately 1600 angstroms) with a preferred composition of 80 percent nickel and 20 percent iron and a resistance value of about 1000 ohms at room temperature. Resistance values for varying applications would typically be within the range of approximately 500 ohms to approximately 2000 ohms at room temperature, e.g. approximately 25° C. (at permalloy element temperatures up to approximately 400° C., resistance values increase by a factor of up to approximately 3.0). Line widths within permalloy grid 16 may be approximately 6 microns having a 4 micron spacing. Depressions such as 20 typically have a 0.004 inch spacing between the member means and the semiconductor body such as 10, but their spacing could easily vary in the range of approximately 0.001 inch to approximately 0.010 inch. A typical thickness of a semiconductor body or substrate such as 10 is 0.008 inch. (The dimensions provided are illustrative only and are not to be taken as limitations.)

Member means of the typical dimensions indicated have a very small thermal heat capacity and thermal impedance that yield a thermal time constant of about 0.005 seconds. Consequently, a small change in heat input results in a new thermal balance at an appreciably different temperature of the sensing element. This difference can yield a substantial electrical output signal.

The strength-to-weight ratio for such a structure is very favorable, and a two-ended bridge of the above typical dimensions can withstand mechanical shock forces well in excess of 10,000 gravities. Even a single-ended structure of these dimensions when treated as a cantilever beam can be shown to withstand 10,000 gravities of shock.

It is a distinct advantage in many applications to heat the member means, e.g., 32 or 34 as shown in FIGS. 1 and 2, well above room or ambient temperature to optimize its sensing performance. Typical operating temperatures are in the range of approximately 100° to 400° C. Using the preferred permalloy element, this can be accomplished with only a few milliwatts of input power. Such power levels are compatible with integrated electronics which, as previously indicated, can be fabricated on the same semiconductor body with the sensor if desired.

A standard temperature sensor in industry has an electrical impedance of 100 ohms. However, for the purpose of the present invention, such an impedance has many disadvantages. For processing purposes, it is much more difficult to obtain a typical impedance precision of 0.1 percent with an impedance of 100 ohms rather than the typical 1000 ohm impedance preferred for the preferred resistive elements in the present invention. Element failure by electromigration is also a factor in choosing a typical impedance of 1000 ohms for permalloy elements used with the present invention. Electromigration is a physical failure mechanism within a conductor caused by mass flow when currents exceed a critical limit, typically on the order of $10^{-6}$ amperes per square centimeter in permalloy. Therefore, in order to achieve desired operating temperatures within permalloy elements such as 16, a relatively large impedance on the order of 1000 ohms at room temperature (e.g., 25° C.) is desirable, the higher impedance resulting in the desired operating temperatures without exceeding critical current densities.

As a result, typical dimensions of the member means, e.g., 32,34, as specified elsewhere herein must be substantially larger than the 0.001 inch wide by 0.004 inch long microstructures typically reported in the prior art. The larger area of the member means typically necessary for permalloy resistive elements compatible with the present invention are necessary to have sufficient surface area to mount a permalloy grid such as 16. Thus, the preferred 45° orientation of the member means discussed elsewhere herein becomes very important from a processing time standpoint, such an orientation resulting in a minimum processing time in creating the larger microstructures and permitting the creation of bridged microstructures such as shown in FIG. 1.

As has been indicated, for many contemplated applications the preferred thermal-to-electric transducer or static electric element is the permalloy resistive element previously described. When laminated within a silicon nitride member means, the permalloy element is protected from oxidation by air and can be used as a heating element to temperatures in excess of 400° C. Such a permalloy element has a resistance versus temperature characteristic similar to that of bulk platinum, both permalloy and platinum having a thermal coefficient of resistance (TCR) of about 4000 parts per million at 0° C. However, permalloy has been found superior to platinum for structures in accordance with the present invention. Although, platinum is a commonly used material for temperature sensitive resistors, permalloy has the advantage of a resistivity about twice that of platinum. Further, in thin films, permalloy achieves maximum TCR in the thickness range of about 800 to 1600 angstroms, whereas platinum films must be at least 3500 angstroms thick (permalloy achieves its maximum TCR at a thickness of about 1600 angstroms, but 800 angstroms has been selected as a preferred thickness since resistivity is doubled and TCR is only slightly less than at 1600 angstroms). Consequently, using a permalloy element 800 angstroms in thickness, the same resistance requires only one-eighth the surface area that would be required for platinum, thus increasing the thermal efficiency of the sensing means, reducing its required area, and lowering the unit cost.

Thus, the permalloy element is both an efficient heater element and an efficient sensing element for temperature changes of microstructures such as those disclosed, and the combination of both heating and sensing functions in the same element on a substantially thermally isolated structure makes possible its low cost, its small thermal capacity, and its favorable sensitivity and fast response.

Further, a permalloy heater/sensor laminated into a supporting insulating film of silicon nitride typically on the order of one micron thick provides passivation against oxygen, particularly at elevated temperatures, for the permalloy film. It also permits precision control of dimensions of the member means, e.g., 32,34, because of the high resistance to process etching possessed by the silicon nitride. In addition, it permits deep etching to yield depressions such as 20 of dimensions such as 0.001 inch to 0.010 inch for control of the principal thermal conductance factor.

Accordingly, using preferred embodiments of the present invention, permalloy forms both a temperature sensor and heater/radiation source in combination with the microstructure disclosed. Use of silicon nitride as a supporting and passivating material permits etching times that are needed to achieve the desired structure. In addition, orientation in accordance with the present invention provides undercutting in a minimum amount of time and achieves the desired structure without artificial etch stops. In addition, the use of deep anisotropic etching to control depression depth to the 0.001 to 0.010 inch range achieves greater thermal isolation than is possible using conventional emplacements of thermal-to-electric or static electric elements in integrated semiconductor devices.

The present invention is to be limited only in accordance with the scope of the appended claims, since others skilled in the art may devise other embodiments and methods still within the limits of the claims. For example, while depressions such as 20 are typically formed using preferential etching techniques such as those described elsewhere herein, embodiments in accordance with the present invention are not limited to those with depressions formed by techniques described herein.

The embodiments of the invention in which an exclusive property or right is claimed are defined as follows:

1. A method of fabricating a semiconductor device comprising member means having a predetermined configuration suspended over a depression etched into a first surface of a semiconductor body, the member means being connected to the first surface at least at one location, the depression opening to the first surface around at least a portion of the predetermined configuration, the method comprising the steps of:

providing a semiconductor body with the first surface having a predetermined orientation with respect to a crystalline structure in the semiconductor body;

applying a layer of material of which the member means is comprised onto the first surface;

exposing at least one predetermined area of the first surface, the exposed surface area being bounded in part by the predetermined configuration to be suspended, the predetermined configuration being oriented so that an anisotropic etch placed on the exposed surface area will undercut the predetermined configuration in a substantially minimum time; and applying the anisotropic etch to the exposed surface area to undercut the member means and create the depression.

2. A method of fabricating a semiconductor device comprising member means having a predetermined configuration bridging a depression etched into a first surface of a semiconductor body, the member means being connected to the first surface at first and second substantially opposing ends of the predetermined configuration, the depression opening to the first surface around at least a portion of the predetermined configuration, the method comprising the steps of:

providing a semiconductor body with the first surface having a predetermined orientation with respect to a crystalline structure in the semiconductor body;

applying a layer of material of which the member means is comprised onto the first surface;

exposing first and second predetermined areas of the first surface, the exposed surface area being bounded in part by the predetermined configuration to be bridged, the predetermined configuration being oriented so that an anisotropic etch placed on the exposed surface area will undercut the predetermined configuration in a substantially minimum time; and applying the anisotropic etch to the exposed surface area to undercut the member means and create the depression.

3. The method of claim 1 or 2 wherein:
the semiconductor body comprises (100) silicon having a (100) plane and a [110] direction;
the first surface of the semiconductor body is substantially parallel to the (100) plane; and
the predetermined configuration is oriented at a non-zero angle to the [110] direction.

4. The method of claim 3 wherein the predetermined configuration comprises a substantially straight edge which is oriented at the non-zero angle.

5. The method of claim 4 wherein the non-zero angle is substantially 45 degrees, whereby the member means will be undercut with maximum efficiency.

6. The method of claim 3 wherein the predetermined configuration has an axis which is oriented at the non-zero angle.

7. The method of claim 6 wherein the non-zero angle is substantially 45 degrees, whereby the member means will be undercut with maximum efficiency.

8. The method of claim 3 wherein the non-zero angle is substantially 45 degrees, whereby the member means will be undercut with maximum efficiency.

* * * * *